United States Patent
Huang et al.

(10) Patent No.: US 8,995,196 B2
(45) Date of Patent: Mar. 31, 2015

(54) METHOD OF SORTING A MULTI-BIT PER CELL NON-VOLATILE MEMORY AND A MULTI-MODE CONFIGURATION METHOD

(75) Inventors: Han-Lung Huang, Hsinchu (TW); Ming-Hung Chou, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 845 days.

(21) Appl. No.: 13/210,195

(22) Filed: Aug. 15, 2011

(65) Prior Publication Data

US 2013/0044542 A1   Feb. 21, 2013

(51) Int. Cl.
| | | |
|---|---|---|
| G11C 11/34 | (2006.01) | |
| G11C 7/00 | (2006.01) | |
| G11C 16/10 | (2006.01) | |
| G11C 29/44 | (2006.01) | |
| G11C 29/50 | (2006.01) | |
| G11C 11/56 | (2006.01) | |
| G11C 16/34 | (2006.01) | |
| G11C 16/00 | (2006.01) | |

(52) U.S. Cl.
CPC ............... *G11C 16/10* (2013.01); *G11C 29/44* (2013.01); *G11C 29/50004* (2013.01); *G11C 11/5621* (2013.01); *G11C 16/3418* (2013.01); *G11C 16/349* (2013.01); *G11C 11/5628* (2013.01); *G11C 16/00* (2013.01); *G11C 2211/5641* (2013.01)
USPC ...................... 365/185.19; 365/200

(58) Field of Classification Search
CPC ........... G11C 11/5621; G11C 11/5628; G11C 16/00; G11C 16/10; G11C 16/3418; G11C 16/349; G11C 2211/5641; G11C 29/44; G11C 29/50004

USPC .............................................. 365/185.03, 200
See application file for complete search history.

(56) References Cited

U.S. PATENT DOCUMENTS

| | | | |
|---|---|---|---|
| 2002/0122330 A1* | 9/2002 | Houston | 365/154 |
| 2007/0201274 A1* | 8/2007 | Yu et al. | 365/185.09 |
| 2008/0052015 A1* | 2/2008 | Ozawa et al. | 702/57 |
| 2008/0112222 A1* | 5/2008 | Shirakawa | 365/185.03 |
| 2008/0209282 A1* | 8/2008 | Lee et al. | 714/54 |
| 2010/0332922 A1* | 12/2010 | Chang et al. | 714/704 |
| 2011/0090734 A1* | 4/2011 | Burger et al. | 365/185.03 |
| 2011/0153919 A1 | 6/2011 | Sabbag | |
| 2012/0008387 A1* | 1/2012 | Han-Lung et al. | 365/185.03 |

FOREIGN PATENT DOCUMENTS

TW     200739593     10/2007

* cited by examiner

*Primary Examiner* — Tuan T Nguyen
*Assistant Examiner* — Khamdan Alrobaie
(74) *Attorney, Agent, or Firm* — Donald E. Stout; Stout, Uxa & Buyan, LLP

(57) ABSTRACT

A method of sorting a multi-bit per cell non-volatile memory includes programming and reading to test an n-bit-per-cell (n-bpc) non-volatile memory, which has a plurality of m-bpc pages, where m is a positive integer from 1 through n. If the m-bpc page fails the test, counting a block associated with the failed m-bpc page to (m-1)-bpc blocks, wherein each said m-bpc page is subjected to at most one time of programming and reading. When m is equal to 1, the 0-bpc block corresponds to a bad block.

9 Claims, 12 Drawing Sheets

|  | L-Bit-Page (LSB) | M-Bit-Page (CSB) | H-Bit-Page (MSB) |
|---|---|---|---|
| WL0 | 00h | 02h | 05h |
| WL1 | 01h | 04h | 08h |
| WL2 | 03h | 07h | 0Bh |
| WL3 | 06h | 0Ah | 0Eh |
| . . . . |  | . . . . |  |
| WL61 | B4h | B8h | BCh |
| WL62 | B7h | BBh | BEh |
| WL63 | BAh | BDh | BFh |

|  | L-Bit-Page (LSB) | M-Bit-Page (CSB) | H-Bit-Page (MSB) |
|---|---|---|---|
| WL0 | 00h | 02h | 05h |
| WL1 | 01h | 04h | 08h |
| WL3 | 03h | 07h | 0Bh |
| WL6 | 06h | 0Ah | 0Eh |
| . . . . | | . . . | |
| WL61 | B4h | B8h | BCh |
| WL62 | B7h | BBh | BEh |
| WL63 | BAh | BDh | BFh |

FIG.3D

BD
h→BEh→BFh.
METHOD OF SORTING A MULTI-BIT PER CELL NON-VOLATILE MEMORY AND A MULTI-MODE CONFIGURATION METHOD

BACKGROUND OF THE INVENTION

1. Field of the Invention

The present invention generally relates to a non-volatile memory, and more particularly to a method of sorting a multi-bit per cell flash memory and a multi-mode configuration method for a multi-bit per cell flash memory.

2. Description of Related Art

Flash memory is a non-volatile solid state memory device that can be electrically erased and reprogrammed. Conventional flash memory stores a single bit of information in each memory cell such that each memory cell can be programmed to assume two possible states. The conventional flash memory is thus commonly referred to as single-bit per cell flash memory. Modern flash memory is capable of storing two or more bits of information in each memory cell such that each memory cell can be programmed to assume more than two possible states. The modern flash memory is thus commonly referred to as multi-bit per cell flash memory.

A multi-bit per cell flash memory chip, such as 3-bit per cell (3-bpc) flash memory, may ordinarily contain defective or bad blocks. Even though the bad blocks cannot be operated to the full in the 3-bpc mode, the flash memory may probably be operated in 2-bpc mode or in 1-bpc mode. As a result, the flash memory chip with defective block(s) need not be discarded. Whether the flash memory chip with defective block(s) is capable of being operated in lesser-bit per cell mode can be determined (or tested) by sorting, for example, via programming and reading the flash memory.

FIG. 1A shows a conventional page program/read sequence in a block for a 3-bpc flash memory, which performs page program/read in the following order:

00h→01h→02h→03h→04h→05h→06h→07h→ . . . BDh→BEh→BFh.

FIG. 1B illustrates a flow diagram of a conventional method of sorting a flash memory. According to the illustrated flow diagram, the flash memory is subjected to 3-bpc mode sorting (step 11), 2-bpc mode sorting (step 12) and 1-bpc mode sorting (step 13). Specifically speaking, in the 3-bpc mode sorting, all (192) pages including low-bit pages, mid-bit pages and high-bit pages (i.e., 00h→01h→02h→03h→04h→05h→ . . . BDh→BEh→BDh) are subjected to program/read. In the 2-bpc mode sorting, all (128) pages including low-bit pages and mid-bit pages (i.e., 00h→01h→02h→03h→04h→06h→07h→ . . . BAh→BBh→BDh) are subjected to program/read. In the 1-bpc mode sorting, all (64) low-bit pages (i.e., 00h→01h→03h→06h→ . . . BAh) are subjected to program/read. As a result, the low-bit pages are sorted (or tested) three times and the mid-bit pages are sorted two times.

For the reason that the conventional method could not effectively and economically sort a flash memory, a need has thus arisen to propose a novel scheme for sorting a multi-bit per cell flash memory.

SUMMARY OF THE INVENTION

In view of the foregoing, it is an object of the embodiment of the present invention to provide a method of sorting a multi-bit per cell non-volatile memory such as a flash memory. The embodiment further provides a multi-mode scheme of configuring a flash memory chip or chips such that the sorted blocks may be optimally operated in their respectively modes.

According to one embodiment, a method of sorting a multi-bit per cell non-volatile memory comprises programming and reading to test an n-bit-per-cell (n-bpc) non-volatile memory, which has a plurality of m-bpc pages, where in is a positive integer from 1 through n. If the m-bpc page fails the test, counting a block associated with the failed m-bpc page to (m−1)-bpc blocks; wherein each said m-bpc page is subjected to at most one time of programming and reading. When m is equal to 1, the 0-bpc block corresponds to a bad block.

According to another embodiment, a multi-mode configuration method for a multi-bit per cell non-volatile memory comprises sorting at least one n-bit-per-cell (n-bpc) non-volatile memory to obtain capacity information; and configuring said at least one non-volatile memory according to the capacity information such that blocks of said at least one non-volatile memory are operated in distinct modes with different number of bits per cell.

BRIEF DESCRIPTION OF THE DRAWINGS

FIG. 3D shows a page program/read sequence adopted in FIG. 3A;

DETAILED DESCRIPTION OF THE INVENTION

Figure 2:
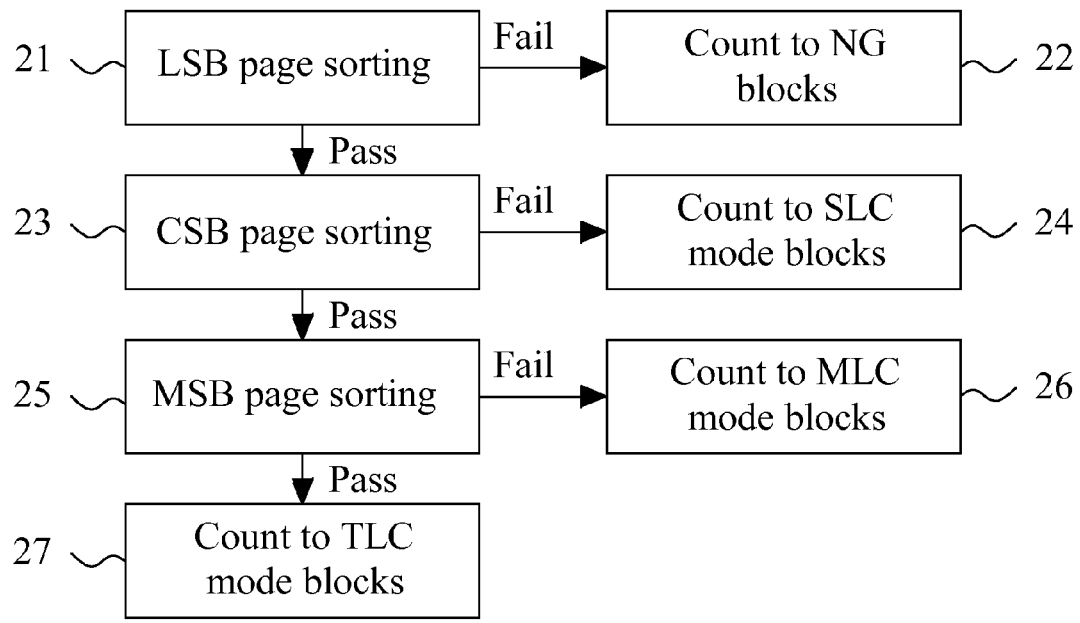
FIG. 2 shows a flow diagram illustrative of a method of sorting a multi-bit per cell non-volatile memory according to one embodiment of the present invention.

FIG. 2 shows a flow diagram illustrative of a method of sorting a multi-bit per cell nonvolatile memory according to one embodiment of the present invention. A three-bit per cell flash memory is exemplified in, but not intended to limit, the embodiment.

In the embodiment, the memory is sorted in an order from a least-significant bit (LSB) page toward a most-significant bit (MSB) page. With respect to a three-bit per cell flash memory, for example, the memory is sorted in the order of a LSB page, a center-significant bit (CSB) page and a MSB page. In this specification, the LSB page, the CSB page and the MSB page are interchangeably called a low-bit page, a mid-bit page and a high-bit page respectively; or interchangeably called a one-bit-per-cell (1-bpc) page, a 2-bpc page and 3-bpc page respectively.

Referring to FIG. 2, the LSB page is sorted (or tested), in step 21, by programming and reading. If the LSB page fails the test (e.g., the programming data does not agree with the reading data or the amount of error bits exceeds a predetermined value), the block associated with the failed LSB page is counted to bad (or NG) blocks (step 22). If the LSB page passes the test in step 21, the flow proceeds to step 23, in which the CSB page is sorted. If the CSB page fails the test, the block associated with the failed. CSB page is counted to 1-bit-per-cell (1-bpc) mode blocks (step 24). If the CSB page passes the test in step 23, the flow proceeds to step 25, in which the MSB page is sorted. If the MSB page fails the test, the block associated with the failed MSB page is counted to 2-bit-per-cell (2-bpc) mode blocks (step 26), otherwise the block associated with the passed MSB page is counted to 3-bit per-cell. (3-bpc) mode blocks (step 27). Generally speaking, in the embodiment, an n-bit-per-cell (n-bpc) non-volatile memory is tested by programming and reading, wherein the non-volatile memory has a plurality of m-bpc pages, and m is a positive integer from 1 through n. If the m-bpc page fails the test, counting a block associated with the failed m-bpc page to (m−1)-bpc blocks, wherein each said m-bpc page is subjected to at most one time of programming and reading. When m is equal to 1, the 0-bpc block corresponds to a bad block. According to one aspect of the embodiment, each page is subjected to at most one time of sorting. However, in the conventional method, each of most pages is subjected to two or more times of sorting. Therefore, the method according to the embodiment is more efficient and faster than the conventional method. In this specification, the 1-bpc, the 2-bpc and 3-bpc modes may interchangeably be called. SLC, MLC and TLC modes respectively.

Figure 3A:
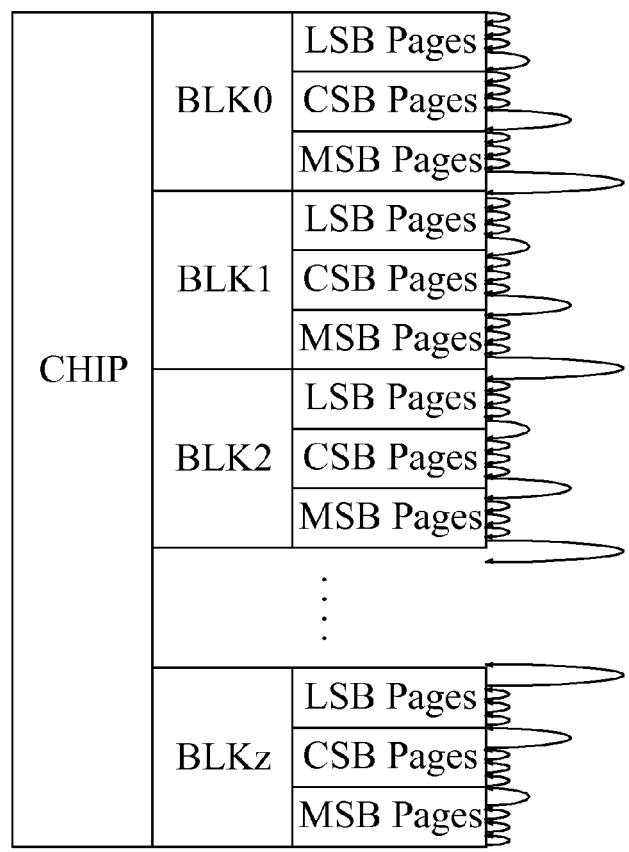
FIG. 3A schematically illustrates a first specific embodiment according to the flow of FIG. 2.
Figure 3B:
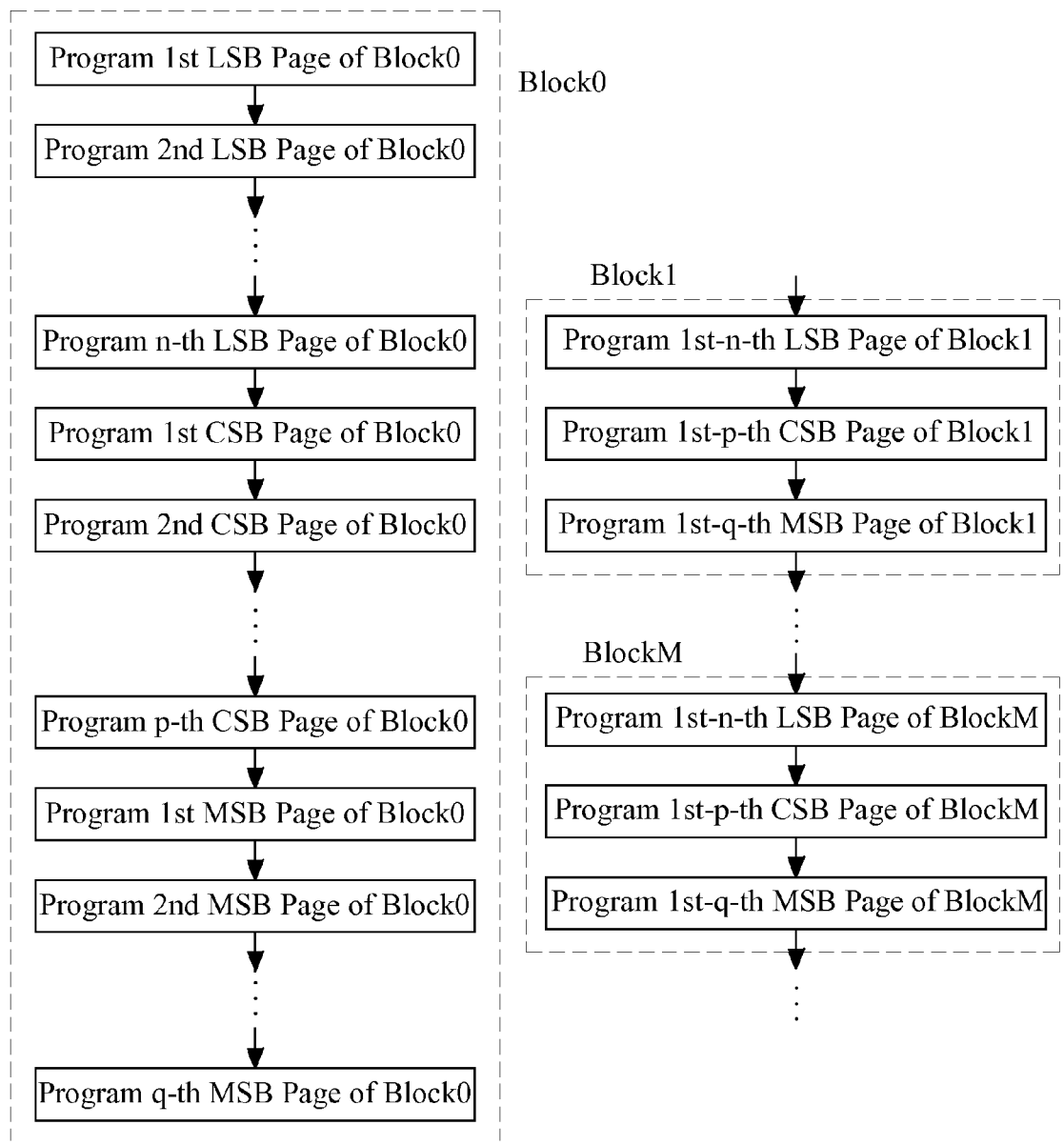
FIG. 3B shows an exemplary flow diagram associated with FIG. 3A.
Figure 3C:
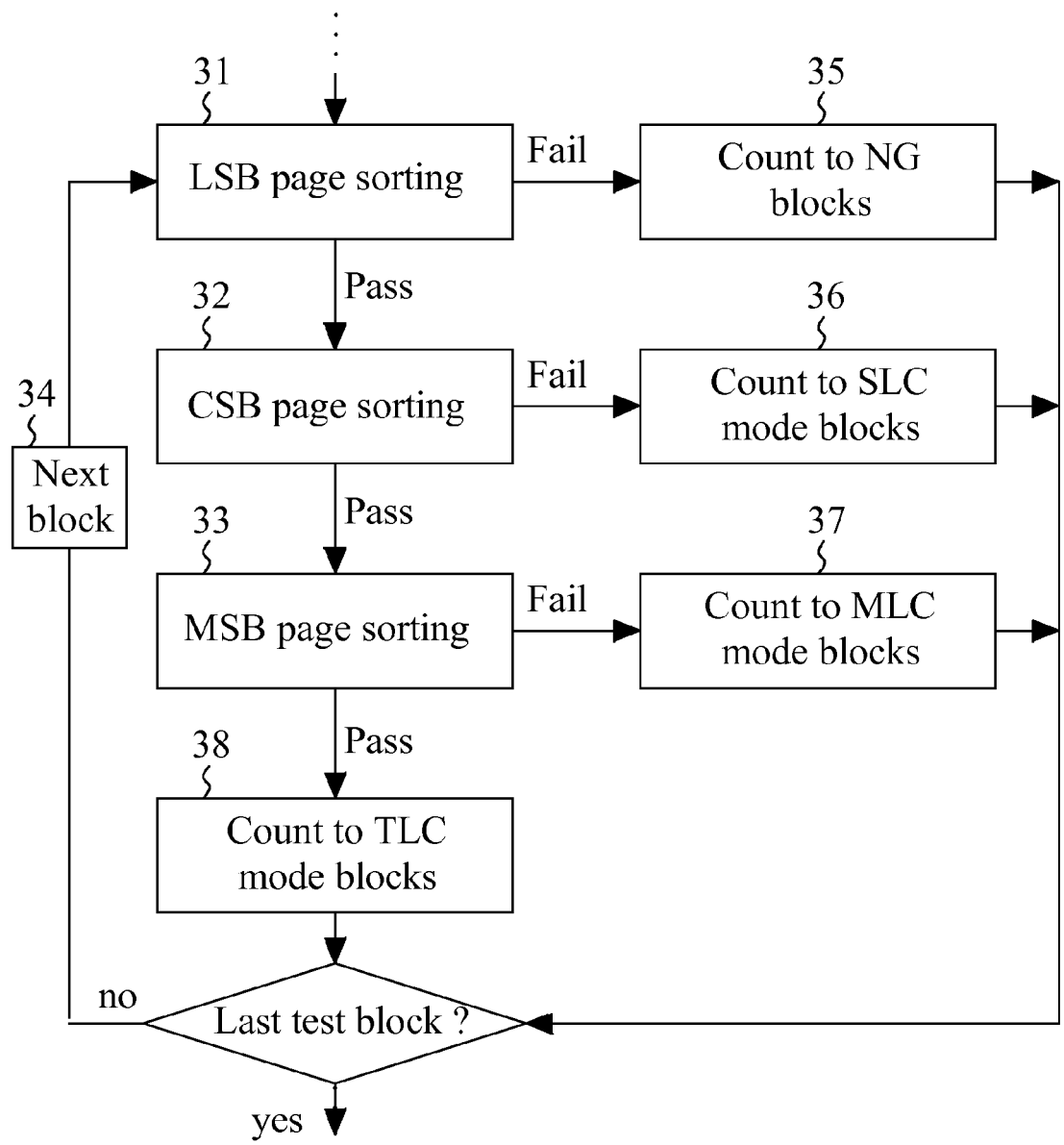
FIG. 3C shows a compact flow diagram of FIG. 3B.

FIG. 3A schematically illustrates a first specific embodiment according to the flow of FIG. 2, FIG. 3B shows an exemplary flow diagram associated with FIG. 3A, and FIG. 3C shows a compact flow diagram of FIG. 3B. The embodiment follows a page program/read sequence as shown in FIG. 3D:

00h→01h→03h→06h→ . . . B7h→BAh→02h→04h→ . . . BDh→05h→08h→ . . . BCh→BEh→BFh.

Generally speaking, with respect to a given block, LSB pages are programmed/read through a block in step 31, followed by programming/reading CSB pages of the block in step 32. Finally, MSB pages of the block are programmed/read in step 33. Afterwards, the above operation is performed with respect to a next block (step 34). It is noted that the next block is not necessarily the block that physically or logically follows the current block. When an LSB page fails the test, the associated block is counted to NG blocks (step 35), and the flow proceeds to a next block (step 34). When a CSB page fails the test, the associated block is counted to SLC mode blocks (step 36), and the flow proceeds to a next block (step 34). When an MSB page fails the test, the associated block is counted to MLC mode blocks (step 37), otherwise the associated block is counted to TLC mode blocks (step 38) and the flow proceeds to a next block (step 34). It is noted that page reading/verifying for each page may be performed immediately after said page has been programmed. Alternatively, page reading/verifying for a plurality of pages (e.g., pages of an entire block) may be performed altogether only after said pages have been programmed.

In FIG. 3B, n, p and q denote the amount of pages of a given block for the LSB pages, CSB pages and MSB pages, respectively. It is noted that n, p and q each may be equal to or less than the amount of the total pages of the LSB pages, the CSB pages and the MSB pages, respectively. In the drawing, M denotes the amount of the blocks, and may be equal to or less than the amount of the total blocks. According to the present embodiment, as all or some pages within a block should be performed before switching to a next block, the method of the present embodiment is called a page-first method.

Figure 4A:
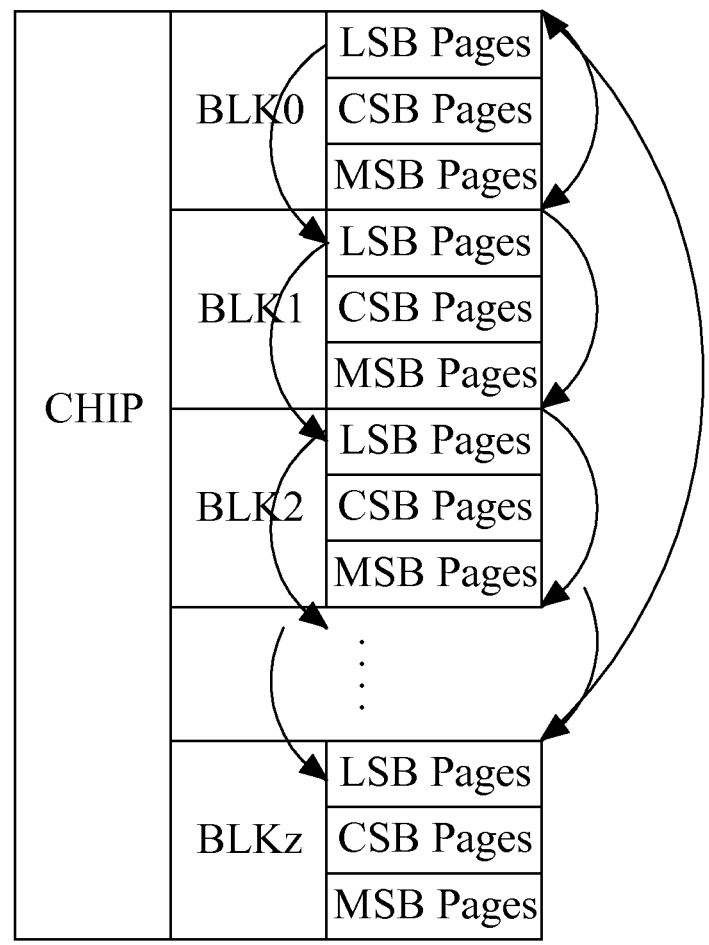
FIG. 4A schematically illustrates a second specific embodiment according to the flow of FIG. 2.
Figure 4B:
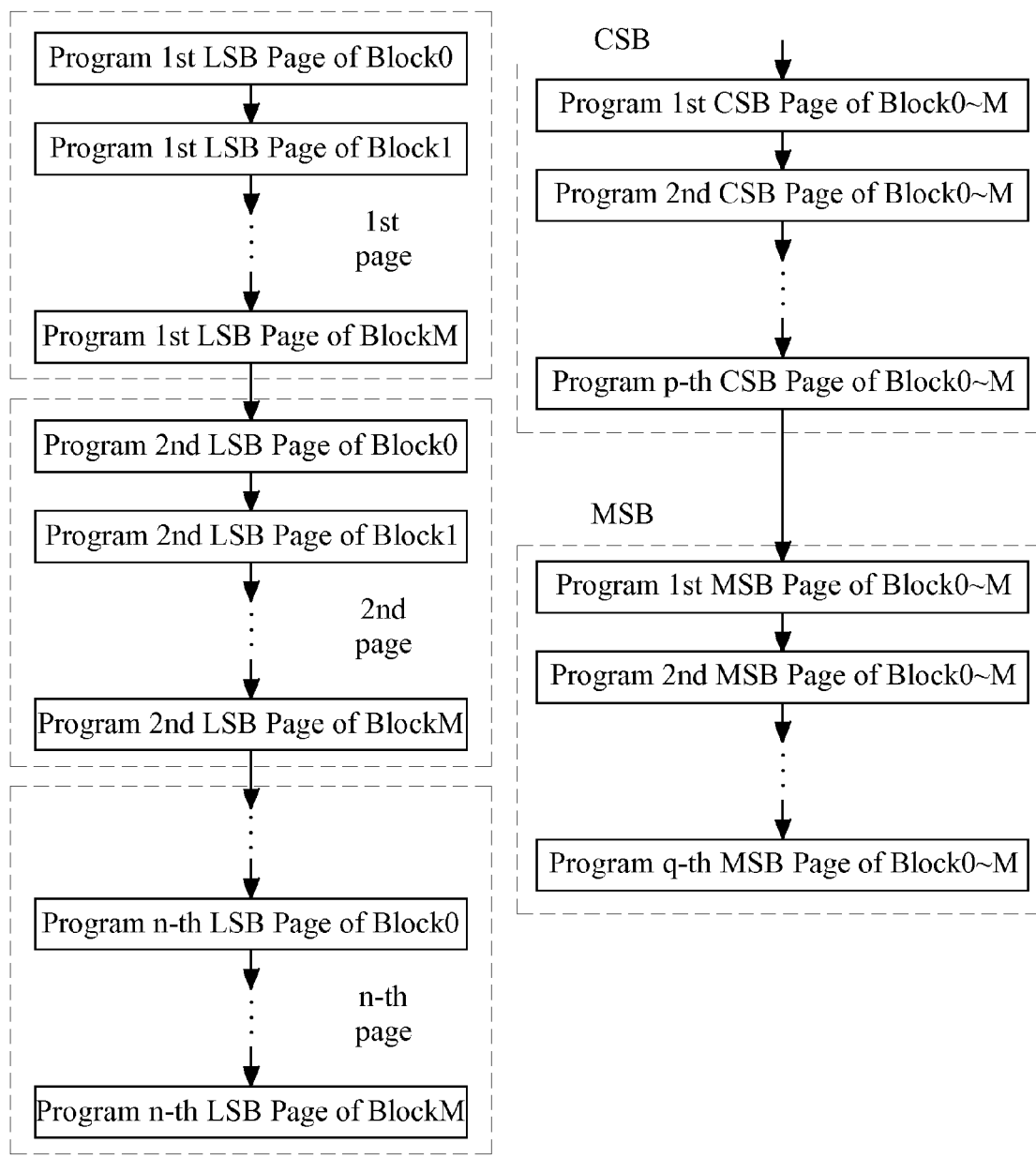
FIG. 4B shows an exemplary flow diagram associated with FIG. 4A.
Figure 4C:
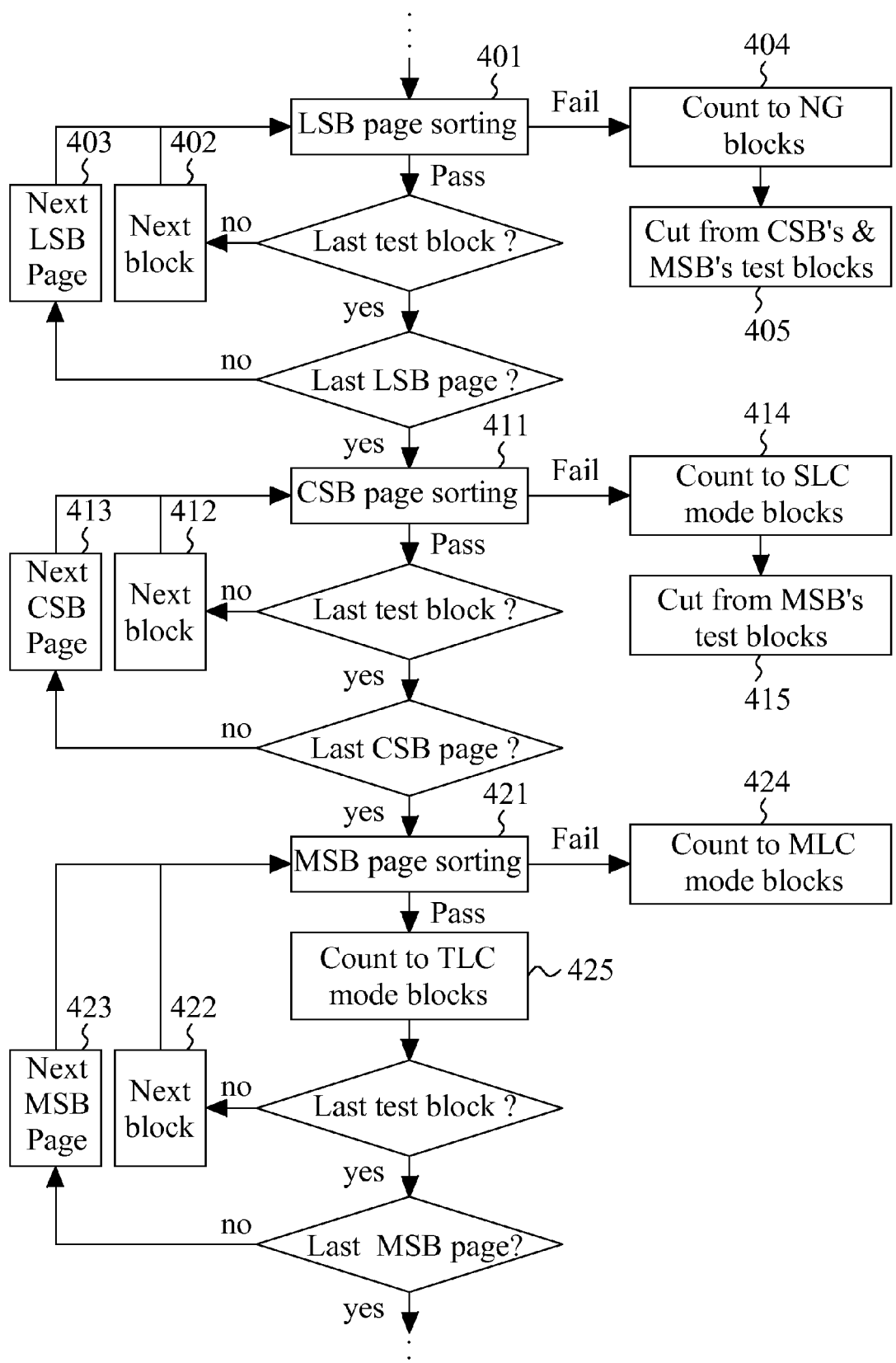
FIG. 4C shows a compact flow diagram of FIG. 4B.

FIG. 4A schematically illustrates a second specific embodiment according to the flow of FIG. 2, FIG. 4B shows an exemplary flow diagram associated with FIG. 4A, and FIG. 4C shows a compact flow diagram of FIG. 4B. The present embodiment is similar to the first specific embodiment except for the following differences. Specifically speaking, with respect to a page of a given word line (e.g., the first LSB page) (step 401), all such pages of the given word line of all (or a predetermined number of) blocks (step 402) are programmed/read. Afterwards, the above operation is performed with respect to a next page (step 403) that follows the program/read sequence as shown in FIG. 3C, that is, all or some LSB pages are performed first (steps 401 to 403), followed by all or some CSB pages (steps 411 to 413) and finally all or some MSB pages (steps 421 to 423). When an LSB page fails the test, the associated block is counted to NG blocks (step 404), and the associated block may pass over further test (step 405). When a CSB page fails the test, the associated block is counted to SLC mode blocks (step 414), and the associated block may pass over further test (step 415). When an MSB page fails the test, the associated block is counted to MLC mode blocks (step 424), otherwise the associated block is counted to TLC mode blocks (step 425). It is noted that page reading/verifying for each page may be performed immediately after said page has been programmed. Alternatively, page reading/verifying for a plurality of pages (e.g., the first LSB pages of all blocks) may be performed altogether only after said pages have been programmed.

According to the example illustrated in FIGS. 4A-4B, the first LSB pages of all or some blocks are tested. The procedure continues until n-th LSB pages are tested. Subsequently, the first CSB pages of all or some blocks are tested. The procedure continues until p-th CSB pages are tested. Finally, the first MSB pages of all or some blocks are tested. The procedure continues until q-th MSB pages are tested. In FIG. 4B, n, p and q denote the amount of pages of a given block for the LSB pages, CSB pages and MSB pages, respectively. It is noted that n, p and q each may be equal to or less than the amount of the total pages of the LSB pages, the CSB pages and the MSB pages, respectively. In the drawing, M denotes the amount of the blocks, and may be equal to or less than the amount of the total blocks. Generally speaking, in the embodiment, (1) r-bpc pages associated with a given word line of a plurality of blocks are tested, and (2) repeating step (1) for r-bpc pages associated with another word line, wherein steps (1) and (2) are performed at least one time for r being an integer ranged between 1 and n (e.g., r may be 1, 2 and 3 for the 3-bpc flash memory). According to the present embodiment, as all or some blocks associated with the page should be performed before switching to a next page, the method of the present embodiment is called a block-first method.

Figure 5A:
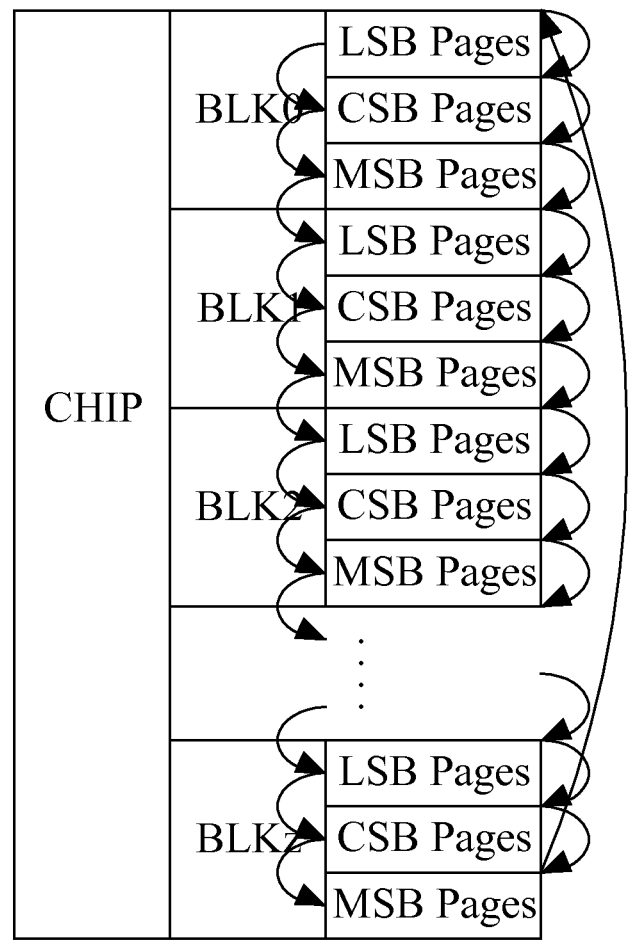
FIG. 5A schematically illustrates a third specific embodiment according to the flow of FIG. 2.
Figure 5B:
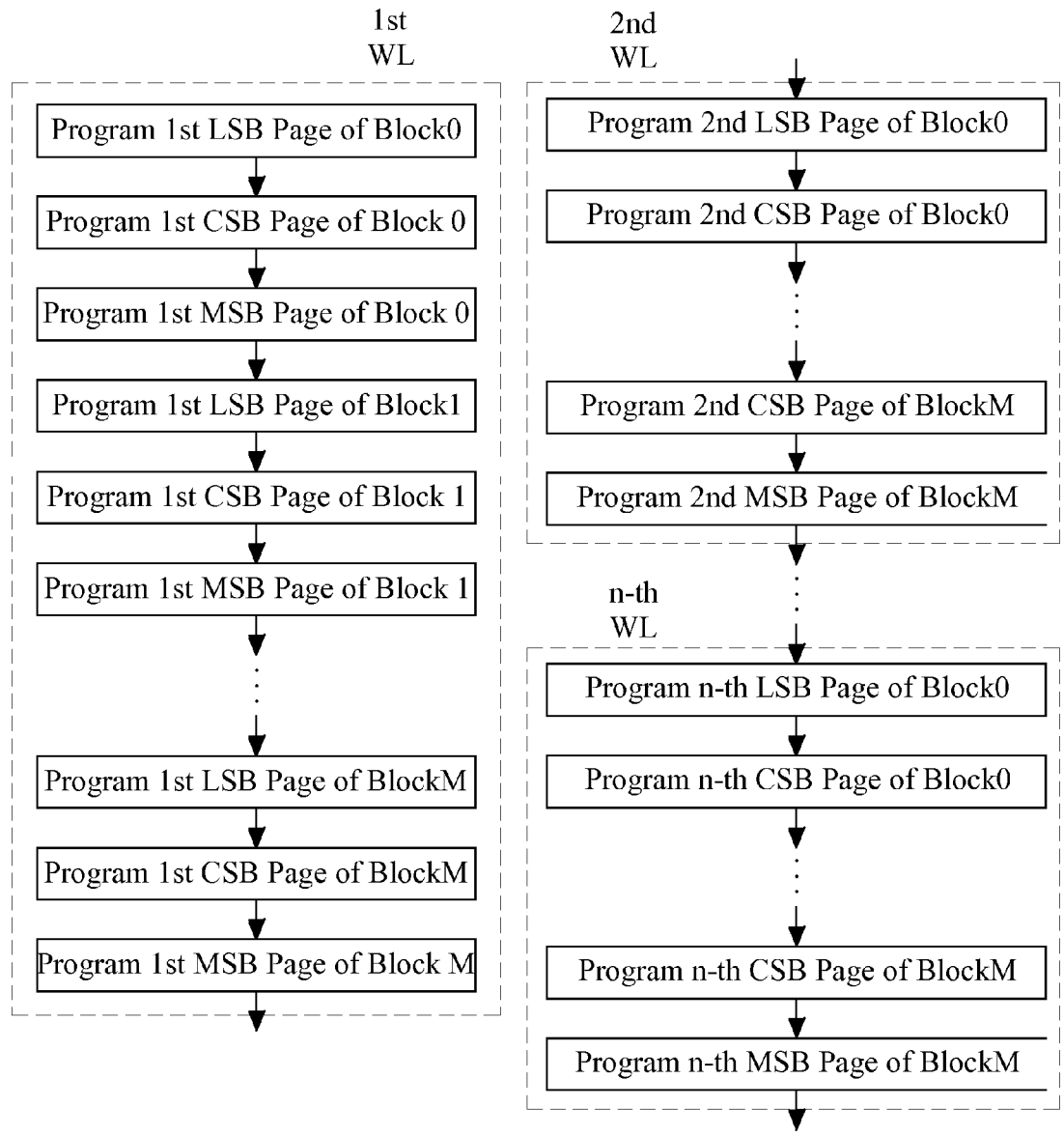
FIG. 5B shows an exemplary flow diagram associated with FIG. 5A.

FIG. 5A schematically illustrates a third specific embodiment according to the flow of FIG. 2 and FIG. 5B shows an exemplary flow diagram associated with FIG. 5A. Specifically speaking, in the embodiment, with respect to a given, word line (WL) (e.g., the first word line), the pages are programmed/read in the order from the LSB page to the MSB page. All such pages of the given word line of all (or a predetermined number of) blocks are programmed/read. Afterwards, the above operation is performed with respect to a next word line that follows the current word line. In FIG. 5B, M denotes the amount of the blocks, and may be equal to or less than the amount of the total blocks. It is noted that page reading/verifying for each page may be performed immediately after said page has been programmed. Alternatively, page reading/verifying for a plurality of pages (e.g., first LSB/CSB/MSB pages of all blocks) may be performed altogether only after said pages have been programmed. According to the present embodiment, as all or some blocks associated with the given word line should be performed before switching to a next word line, the method of the present embodiment is called a block-WL-first method.

Figures 1A, 1B:
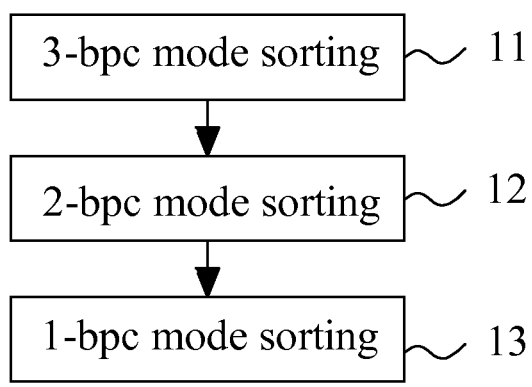
FIG. 1A shows a conventional page program/read sequence in a block for a 3-bpc flash memory.
FIG. 1B illustrates a flow diagram of a conventional method of sorting a flash memory.
Figure 6:
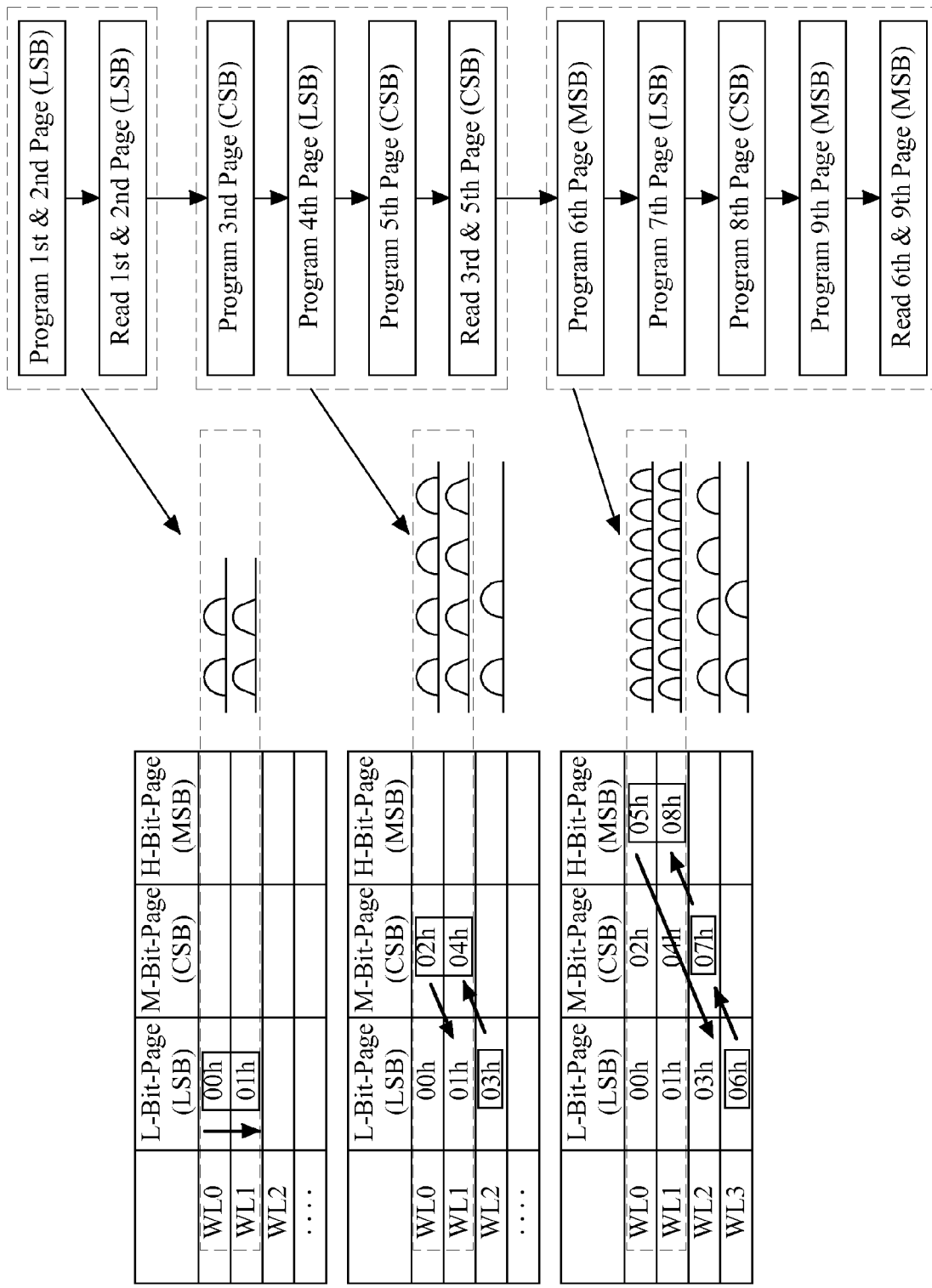
FIG. 6 schematically illustrates a fourth specific embodiment according to the flow of FIG. 2.

FIG. 6 schematically illustrates a fourth specific embodiment according to the flow of FIG. 2. Specifically speaking, in the embodiment, the pages may, but not necessarily, follow a page program/read sequence as shown in FIG. 1A. Specifically speaking, in the embodiment, with respect to two given adjacent word lines (e.g., WL0 and WL1), whenever two pages associated with the two given adjacent word lines have been programmed, those programmed two pages are then read. For example, referring to FIG. 6, with respect to WL0 and WL1, when pages 00h and 01h have been programmed, they are read and if failed, count to NG blocks; when pages 02h, 03h and 04h have been programmed, the pages 02h and 04h associated with WL0 and WL1 are then read and if failed, count to SLC mode blocks; when pages 05h, 06h, 07h and 08h have been programmed, the pages 05h and 08h associated with WL0 and WL1 are then read and if failed, count to MLC mode blocks; if passed, count to TLC mode blocks. Afterwards, the above operation is performed with respect to next two word lines that follow the current two word lines. It is noted that page reading/verifying for the two pages associated with two adjacent word lines may be performed immediately after said two pages have been programmed. Alternatively, page reading/verifying for a plurality of pages more than two pages may be performed altogether only after said plurality of pages have been programmed.

With respect to the flows of the embodiments as demonstrated above, for the purpose of shortening the testing time, the following schemes may be adopted. In one embodiment, whenever a page of a block fails the test, the testing flow associated with that block terminates and that block is then classified according to FIG. 2. In an alternative embodiment, only a portion of the blocks and/or a portion of the pages are subjected to test. Therefore, the number of blocks subjected to testing may not be equal to the number of blocks in an entire flash memory, and/or the number of pages subjected to testing in a block may not be equal to the number of pages in an entire block. In a further embodiment, the first one or two LSB/CSB/MSB pages of the blocks (or a portion of the blocks) are subjected to test, thereby quickly obtaining preliminary block information with acceptable precision. In a further embodiment, all (or some) LSB/CSB pages and first one or two MSB pages are subjected to test. Alternatively, all (or some) LSB/CSB/MSB pages of some blocks but all (or some) LSB pages of other blocks are subjected to test.

According to either one of the four specific embodiments as illustrated above, capacity information such as the number of 3-bpc mode blocks, the number of 2-bpc mode blocks, the number of 1-bpc mode blocks and the number of bad blocks may thus be obtained. According to the obtained capacity information, the operation mode of the flash memory may accordingly be determined. For example, assume that the flash memory has 1000 blocks, and the numbers of the 3-bpc, 2-bpc, 1-bpc mode blocks and bad blocks are 120, 60, 810 and 10 respectively. The capacity of the 3-bpc, 2-bpc, 1-bpc mode may be obtained to be 12% (i.e., 120/1000), 12% (i.e., (1.20+60)*(2/3)/1000) and 33% (i.e., (1.20+60+81.0)*(1/3)/1000) respectively. As the 1-bpc mode has the largest capacity, the flash memory may thus be determined to be optimally operated in the 1-bpc mode.

Figure 7:
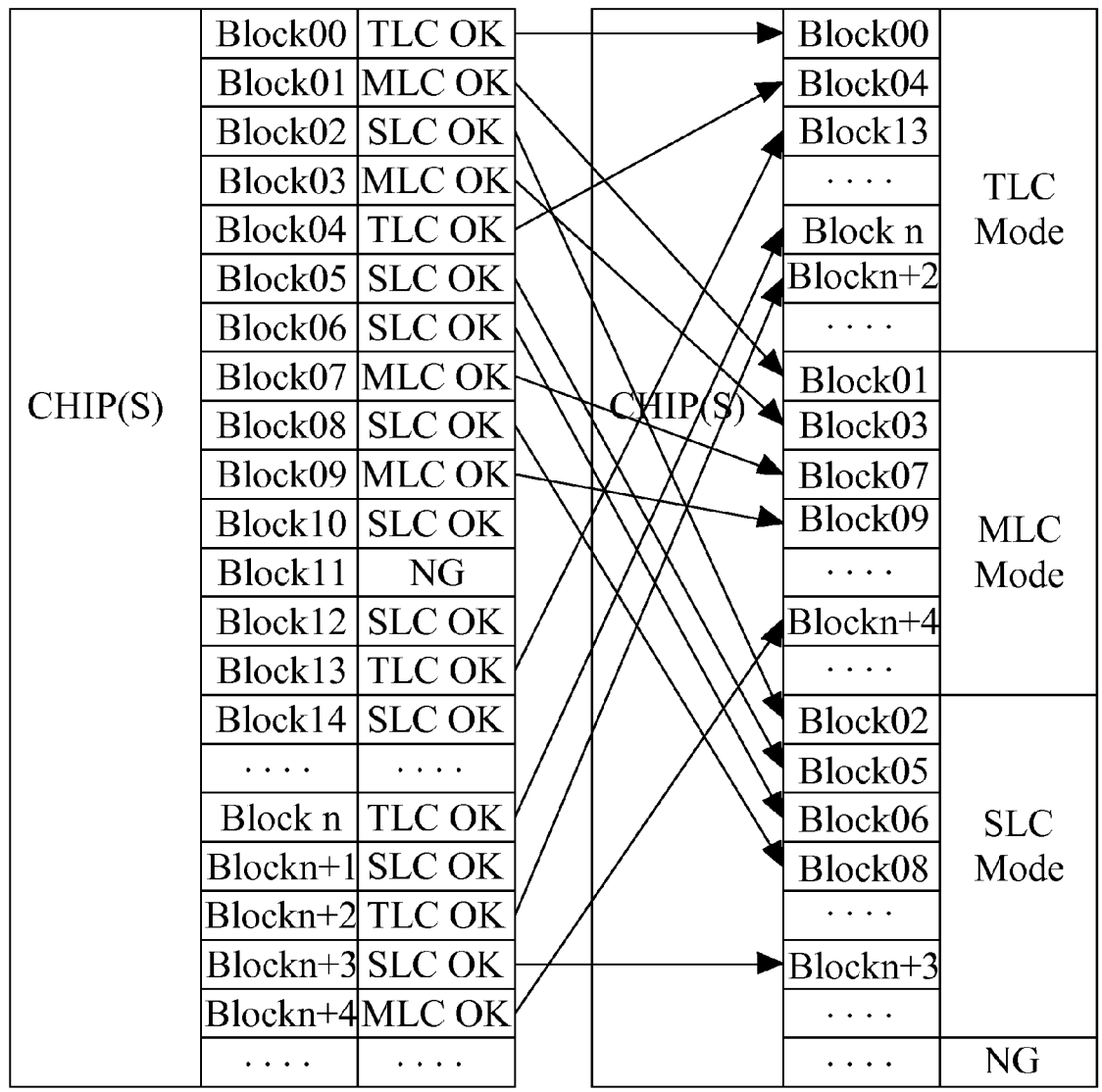
FIG. 7 exemplifies a multi-mode scheme of configuring a flash memory chip or chips.

In addition to the single mode determined according to the capacity information as discussed above, the present invention further provides a multi-mode scheme of configuring a flash memory chip or chips such that the sorted blocks (e.g., according to the flow of FIG. 2) may be operated in their respective modes as exemplified in FIG. 7. In other words, the sorted 1-bpc (or SLC) mode blocks may be operated in the SLC mode; the sorted 2-bpc (or MLC) mode blocks may be operated in the MLC mode; and the sorted 3-bpc (or TLC) mode blocks may be operated in the TLC mode. In general, the capacity of the flash memory chip(s) operated in the multi-mode may be greater than the capacity of the flash memory chip(s) operated in the single-mode. For example, assume again that the flash memory has 1000 blocks, and the numbers of the 3-bpc, 2-bpc, 1-bpc mode blocks and bad blocks are 120, 60, 810 and 10 respectively. Under the multi-mode configuration, the capacity of the 3-bpc, 2-bpc, 1-bpc mode blocks may be obtained to be 12% (i.e., 1.20/1000), 4% (i.e., 60*(2/3)/1000) and 27% (i.e., 810*(1/3)/1000) respectively. The overall flash memory chip(s) thus have capacity of 43% (i.e., 12%+4%+27%), which is greater than the capacity, 33%, of the flash memory operated in the single 1-bpc mode as exemplified above.

Although specific embodiments have been illustrated and described, it will be appreciated by those skilled in the art that various modifications may be made without departing from the scope of the present invention, which is intended to be limited solely by the appended claims.

What is claimed is:

1. A method of sorting a multi-bit per cell non-volatile memory, comprising:
    programming and reading to test an n-bit-per-cell (n-bpc) non-volatile memory, which has n pages associated with a word line;
    if an m-th page fails the test, counting a block associated with the failed m-th page to (m−1)-bpc blocks, where m is a positive integer from 1 through n;
    wherein each said m-th page is subjected to at most one time of programming and reading, the non-volatile memory being tested in an order from the 1-st page toward the n-th page.

2. The method of claim 1, when m is equal to 1 and the 1-st page fails the test, the 0-bpc block corresponds to a bad block.

3. The method of claim 1, with respect to a given block, the 1-st pages are tested, followed by the 2-nd pages and then toward the n-th pages, and subsequently a block next to the given block is tested.

4. The method of claim 1, wherein:
    (1) testing r-th pages associated with a given word line of a plurality of blocks; and
    (2) repeating step (1) for r-th pages associated with another word line;
    wherein steps (1) and (2) are performed at least one time for r being an integer ranged between 1 and n.

5. The method of claim 1, with respect to a given word line, test is performed in an order from the 1-st page toward the n-th page in a block, followed by performing the test in the same order in a next block.

6. The method of claim 1, with respect to two given adjacent word lines, whenever two m-th pages associated with the two given adjacent word lines have been programmed, the programmed two m-th pages are then read.

7. A multimode configuration method for a multi-bit per cell non-volatile memory, comprising:
sorting at least one n-bit-per-cell (n-bpc) non-volatile memory to obtain capacity information; and
configuring said at least one non-volatile memory according to the capacity information such that blocks of said at least one non-volatile memory are operated in distinct modes with different number of bits per cell;
wherein the sorting step comprises programming and reading to test the n-bpc non-volatile memory, which has n pages associated with a word line, each page being subjected to at most one time of programming and reading, the non-volatile memory being tested in an order from the 1-st page toward the n-th page, where m is a positive integer from 1 through n, wherein the sorting step comprises:
if the m-th page fails the test, counting a block associated with the failed m-th page to (m−1)-bpc blocks.

8. The method of claim 7, wherein the capacity information comprises a plurality of respective numbers of p-bit-per-cell blocks, where p is a non-negative integer from 0 to n.

9. The method of claim 7, wherein a 0-bpc block corresponds to a bad block.

\* \* \* \* \*